United States Patent
Yaegashi

(10) Patent No.: US 8,513,130 B2
(45) Date of Patent: Aug. 20, 2013

(54) SEMICONDUCTOR SUBSTRATE AND METHOD OF FABRICATING SEMICONDUCTOR DEVICE

(75) Inventor: Tetsuo Yaegashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/034,238

(22) Filed: Feb. 24, 2011

(65) Prior Publication Data

US 2011/0143459 A1 Jun. 16, 2011

Related U.S. Application Data

(62) Division of application No. 11/507,536, filed on Aug. 22, 2006, now Pat. No. 7,915,172, which is a division of application No. 10/914,332, filed on Aug. 10, 2004, now Pat. No. 7,115,994.

(30) Foreign Application Priority Data

Mar. 19, 2004 (JP) ................................. 2004-080770

(51) Int. Cl.
*H01L 21/311* (2006.01)

(52) U.S. Cl.
USPC ........... 438/695; 438/622; 438/640; 257/296; 257/303; 257/310

(58) Field of Classification Search
USPC ................ 438/622, 640, 695; 257/296, 310, 257/303, 532
See application file for complete search history.

(56) References Cited

U.S. PATENT DOCUMENTS

| 5,002,902 | A |   | 3/1991 | Watanabe |
|-----------|---|---|--------|----------|
| 5,536,672 | A |   | 7/1996 | Miller et al. |
| 5,612,082 | A |   | 3/1997 | Azuma et al. |
| 5,663,092 | A |   | 9/1997 | Lee |
| 5,733,801 | A |   | 3/1998 | Gojohbori |
| 5,780,333 | A | * | 7/1998 | Kim ............................ 438/238 |
| 5,932,905 | A |   | 8/1999 | O'Bryan, Jr. et al. |

(Continued)

FOREIGN PATENT DOCUMENTS

| JP | 63-107037 A | 5/1988 |
| JP | 04-368147 A | 12/1992 |

(Continued)

OTHER PUBLICATIONS

Japanese Office Action dated Feb. 24, 2009, issued in corresponding Japanese Patent Application No. 2004-569583.

*Primary Examiner* — N Drew Richards
*Assistant Examiner* — Ankush Singal
(74) *Attorney, Agent, or Firm* — Westerman, Hattori, Daniels & Adrian, LLP

(57) ABSTRACT

A semiconductor substrate includes a wafer including an element area and a non-element area delineating the element area, a first layered structure situated in the element area, a first insulating film covering the first layered structure, and exhibiting a first etching rate with respect to an etching recipe, a second insulating film covering the first layered structure covered by the first insulating film in the element area, and exhibiting a second etching rate with respect to the etching recipe, the second etching rate being greater than the first etching rate, and a second layered structure situated in the non-element area, wherein the second layered structure includes at least a portion of the first layered structure.

6 Claims, 14 Drawing Sheets

(56) References Cited

U.S. PATENT DOCUMENTS

| | | | |
|---|---|---|---|
| 6,011,286 A | 1/2000 | Wu | |
| 6,140,672 A | 10/2000 | Arita et al. | |
| 6,191,018 B1 * | 2/2001 | Yue et al. | 438/592 |
| 6,249,014 B1 | 6/2001 | Bailey | |
| 6,285,050 B1 | 9/2001 | Emma et al. | |
| 6,326,315 B1 | 12/2001 | Uchiyama et al. | |
| 6,326,651 B1 | 12/2001 | Manabe | |
| 6,342,734 B1 | 1/2002 | Allman et al. | |
| 6,372,518 B1 | 4/2002 | Nasu et al. | |
| 6,417,575 B2 * | 7/2002 | Harada et al. | 257/784 |
| 6,423,997 B1 * | 7/2002 | Takahashi | 257/298 |
| 6,458,602 B1 | 10/2002 | Yunogami et al. | |
| 6,500,724 B1 * | 12/2002 | Zurcher et al. | 438/384 |
| 6,515,323 B1 | 2/2003 | Jung et al. | |
| 6,518,642 B2 * | 2/2003 | Kim et al. | 257/528 |
| 6,528,328 B1 | 3/2003 | Aggarwal et al. | |
| 6,541,279 B2 | 4/2003 | Hayashi et al. | |
| 6,576,510 B2 | 6/2003 | Yamanaka et al. | |
| 6,576,526 B2 | 6/2003 | Kai et al. | |
| 6,579,753 B2 | 6/2003 | Yamanobe | |
| 6,603,161 B2 | 8/2003 | Kanaya et al. | |
| 6,613,586 B2 | 9/2003 | Bailey | |
| 6,730,950 B1 * | 5/2004 | Seshadri et al. | 257/295 |
| 6,734,477 B2 | 5/2004 | Moise et al. | |
| 6,740,974 B2 * | 5/2004 | Yoshitomi | 257/751 |
| 6,759,727 B2 | 7/2004 | Ju | |
| 6,777,776 B2 | 8/2004 | Hieda | |
| 6,784,067 B2 * | 8/2004 | Suzuki | 438/393 |
| 6,809,360 B2 * | 10/2004 | Kato | 257/295 |
| 6,841,819 B2 * | 1/2005 | Saito et al. | 257/295 |
| 6,856,021 B1 | 2/2005 | Iwasaki et al. | |
| 6,876,021 B2 | 4/2005 | Martin et al. | |
| 6,919,244 B1 * | 7/2005 | Remmel et al. | 438/239 |
| 6,919,596 B2 * | 7/2005 | Hara et al. | 257/299 |
| 6,951,788 B2 | 10/2005 | Ohyagi | |
| 7,030,435 B2 | 4/2006 | Gnadinger | |
| 7,064,437 B2 | 6/2006 | Iwasaki et al. | |
| 7,075,134 B2 | 7/2006 | Paz de Araujo et al. | |
| 7,141,848 B1 | 11/2006 | Kuwazawa | |
| 7,202,567 B2 * | 4/2007 | Kikuta et al. | 257/758 |
| 7,307,335 B2 * | 12/2007 | Kim et al. | 257/533 |
| 7,432,170 B2 | 10/2008 | Ohkubo et al. | |
| 7,535,079 B2 * | 5/2009 | Remmel et al. | 257/532 |
| 7,611,956 B2 * | 11/2009 | Kim et al. | 438/379 |
| 7,646,623 B2 * | 1/2010 | Koide | 365/145 |
| 2002/0022335 A1 * | 2/2002 | Chen | 438/396 |
| 2002/0063274 A1 | 5/2002 | Kanaya et al. | |
| 2002/0130345 A1 | 9/2002 | Saigoh et al. | |
| 2002/0177243 A1 | 11/2002 | Matsuura et al. | |
| 2002/0185738 A1 * | 12/2002 | Kim et al. | 257/758 |
| 2003/0008467 A1 | 1/2003 | Kai et al. | |
| 2003/0030084 A1 | 2/2003 | Moise et al. | |
| 2003/0094639 A1 | 5/2003 | Ozaki | |
| 2003/0124748 A1 | 7/2003 | Summerfelt et al. | |
| 2003/0178659 A1 * | 9/2003 | Kato | 257/296 |
| 2003/0183880 A1 * | 10/2003 | Goto et al. | 257/379 |
| 2003/0185068 A1 * | 10/2003 | Saito et al. | 365/200 |
| 2003/0232481 A1 | 12/2003 | Huang et al. | |
| 2004/0046203 A1 | 3/2004 | Morimoto | |
| 2004/0099893 A1 | 5/2004 | Martin et al. | |
| 2004/0099894 A1 | 5/2004 | Kanaya et al. | |
| 2004/0129967 A1 | 7/2004 | Kim et al. | |
| 2005/0054122 A1 | 3/2005 | Celii et al. | |
| 2005/0062130 A1 * | 3/2005 | Ciancio et al. | 257/532 |
| 2005/0116318 A1 | 6/2005 | Park | |
| 2005/0244988 A1 | 11/2005 | Wang et al. | |
| 2006/0134808 A1 | 6/2006 | Summerfelt et al. | |
| 2006/0160252 A1 | 7/2006 | Song et al. | |
| 2006/0267060 A1 | 11/2006 | Kutsunai et al. | |
| 2007/0128758 A1 | 6/2007 | Tanaka et al. | |
| 2007/0190670 A1 * | 8/2007 | Forest | 438/3 |

FOREIGN PATENT DOCUMENTS

| | | |
|---|---|---|
| JP | 09-139469 A | 5/1997 |
| JP | 2002-093868 A | 3/2002 |
| JP | 2003-023138 A | 1/2003 |
| JP | 2004-47943 A | 9/2005 |

* cited by examiner

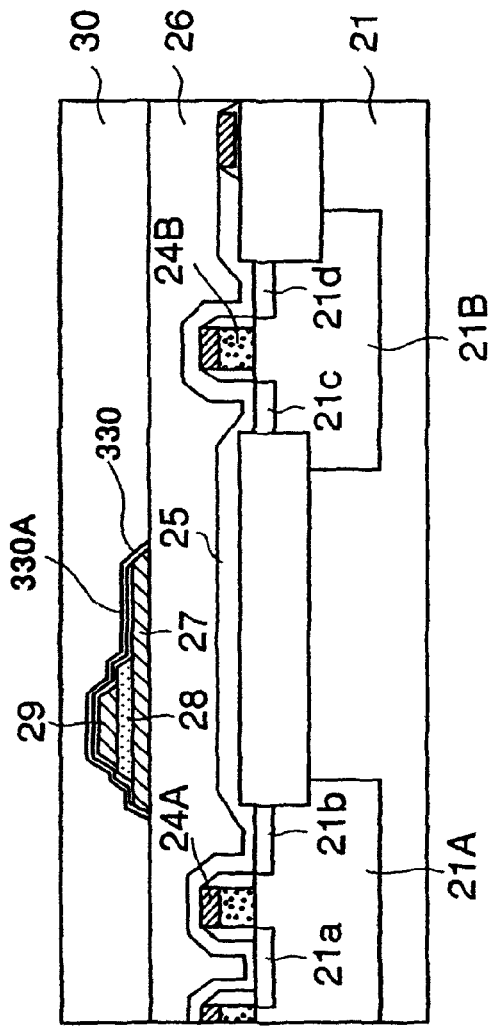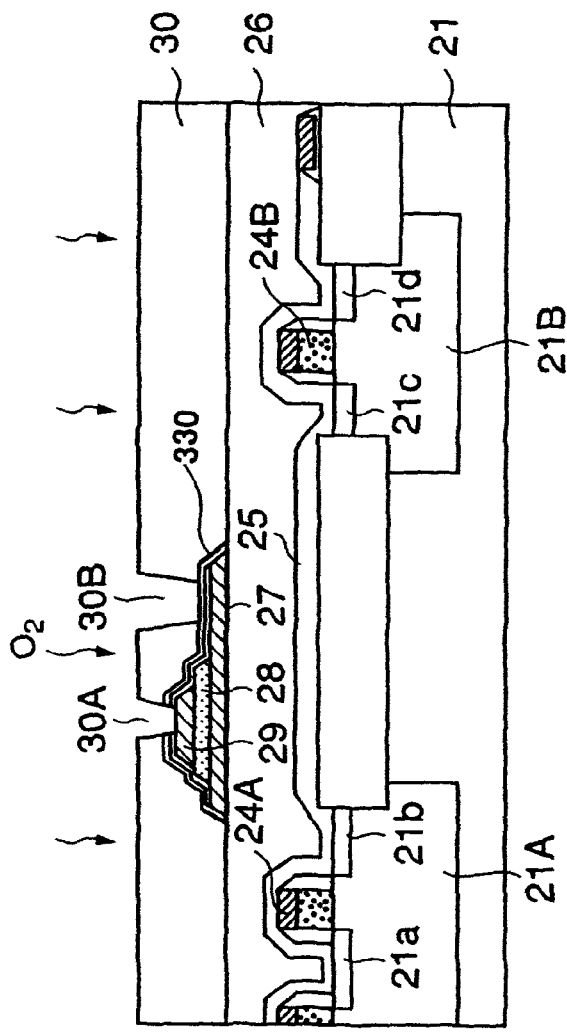
FIG.2A
FIG.2B

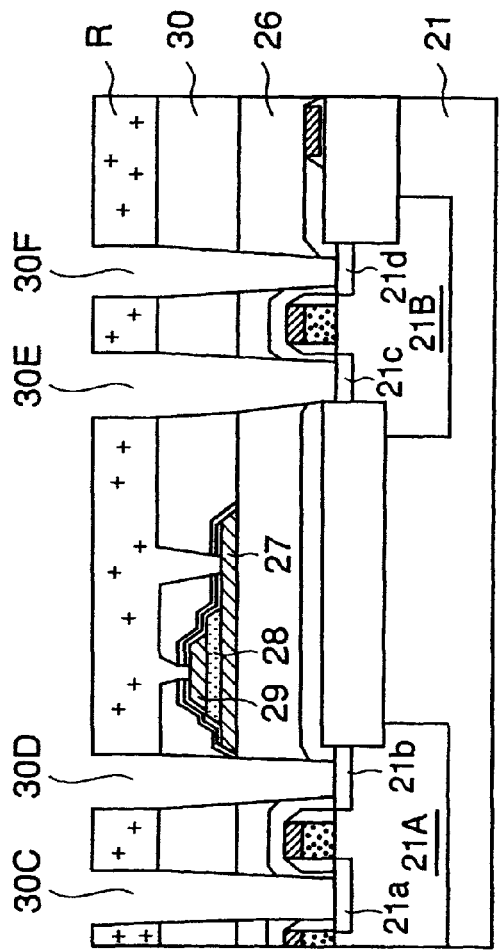
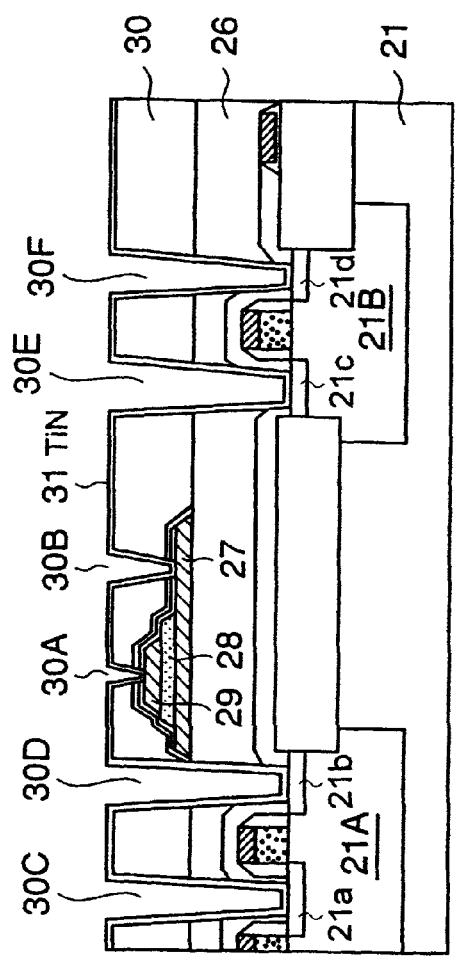
FIG.2C
FIG.2D

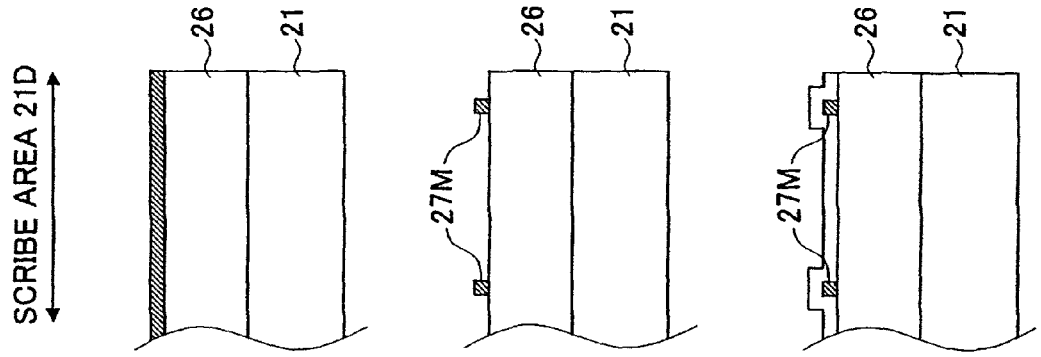
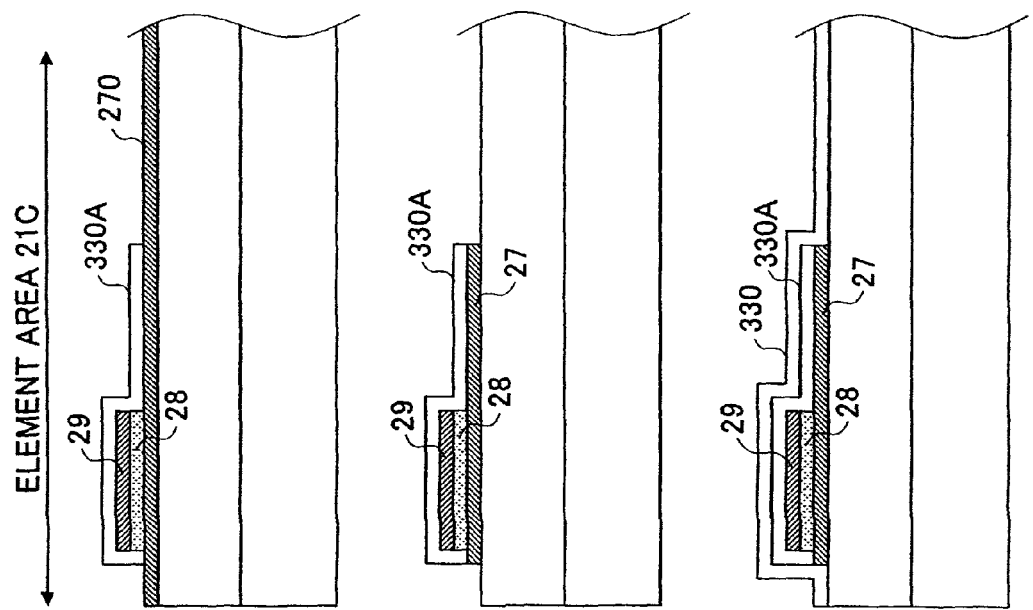
FIG.3A
FIG.3B
FIG.3C

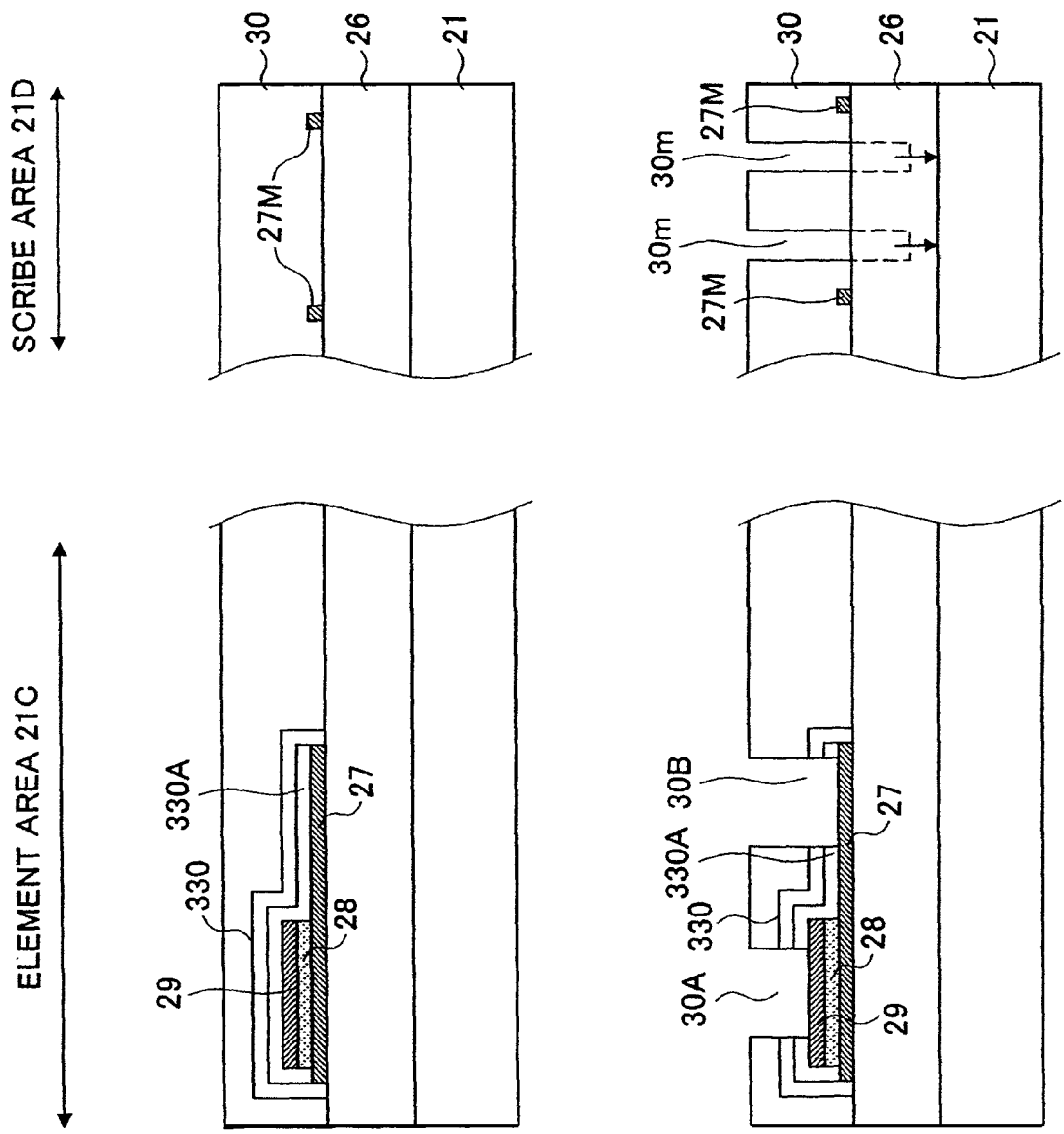

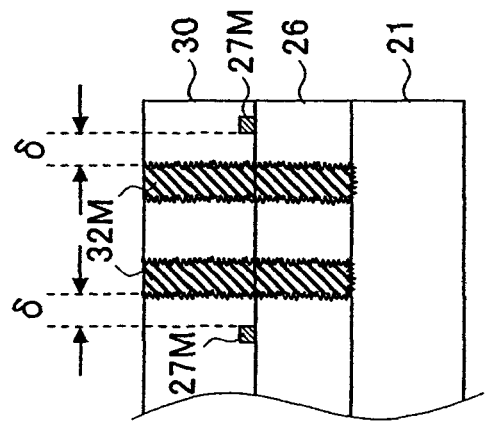
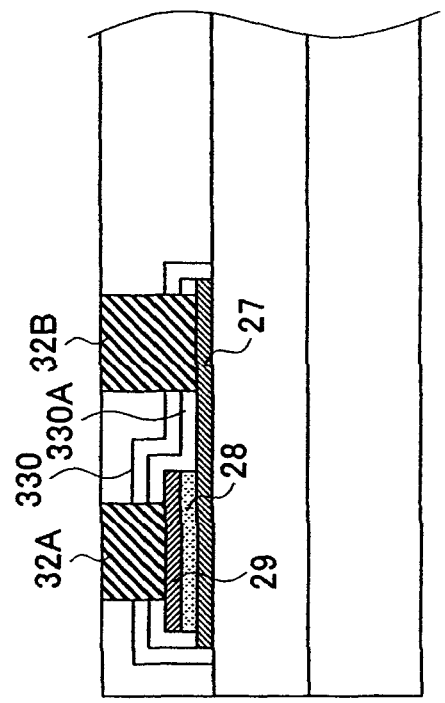
FIG.3F

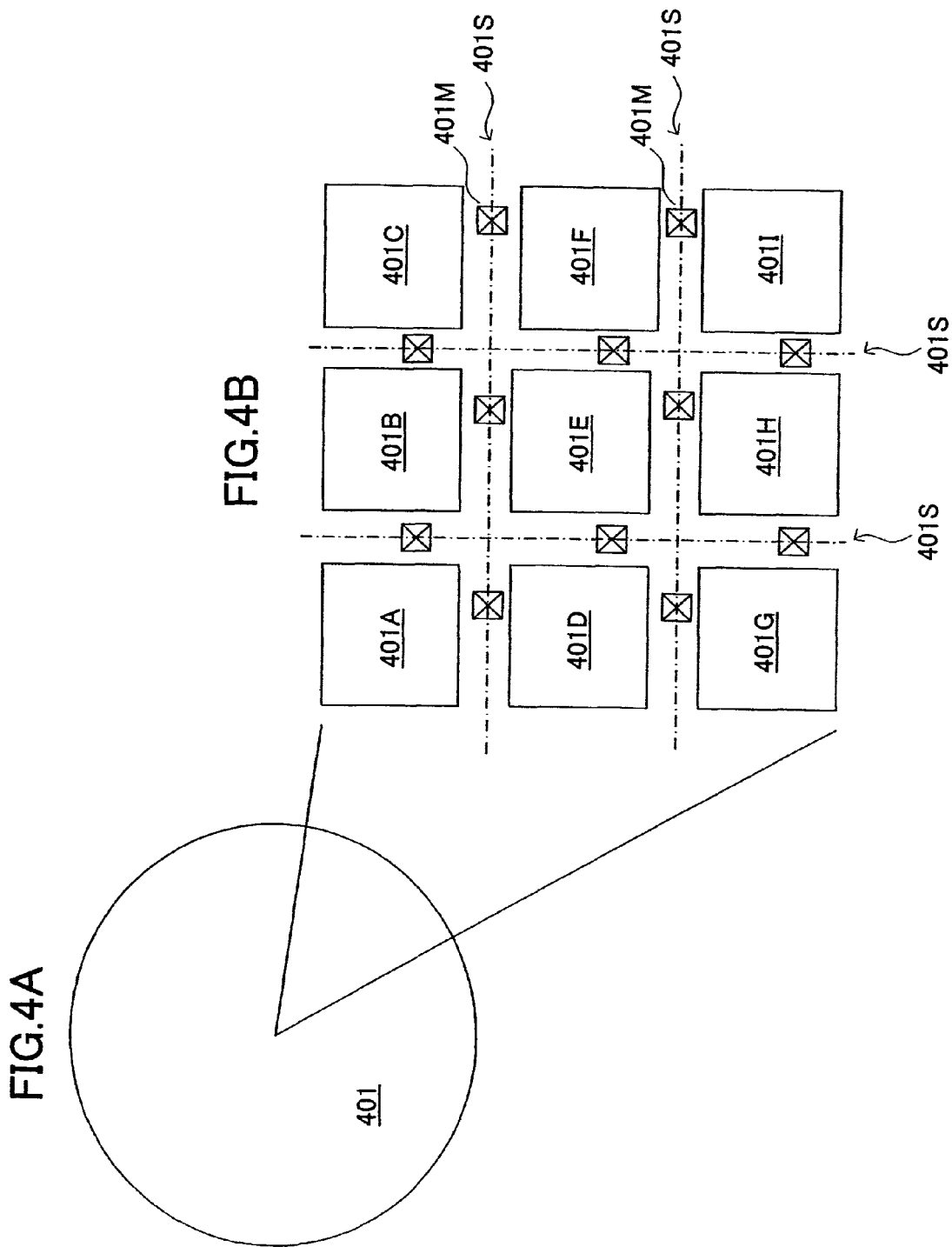

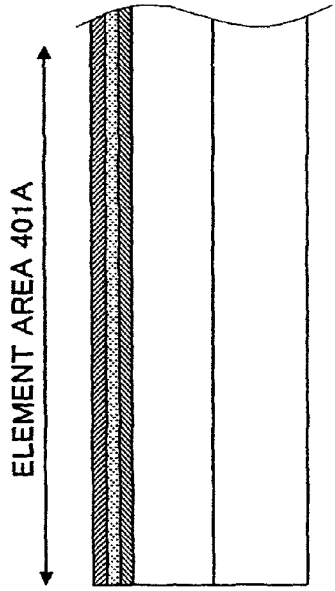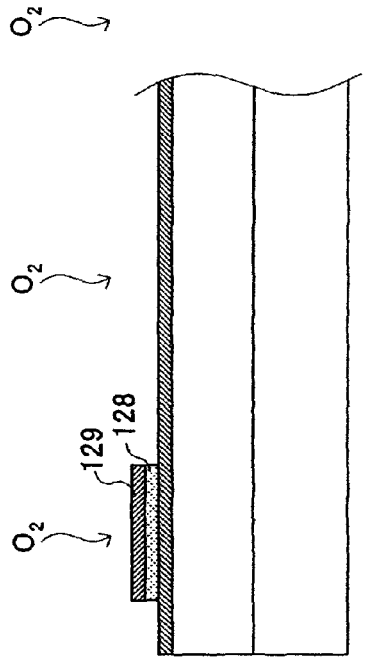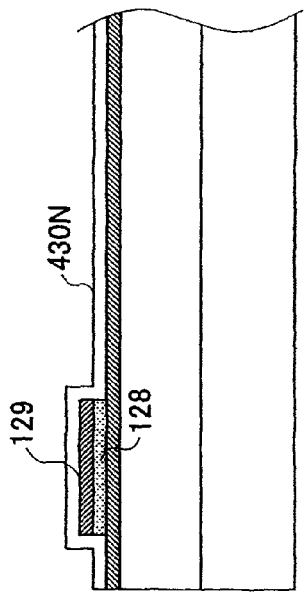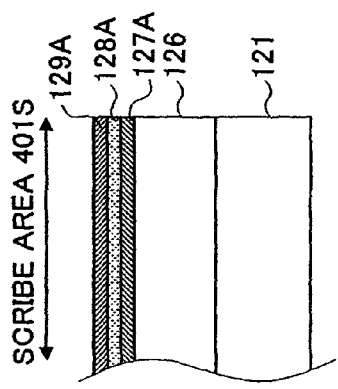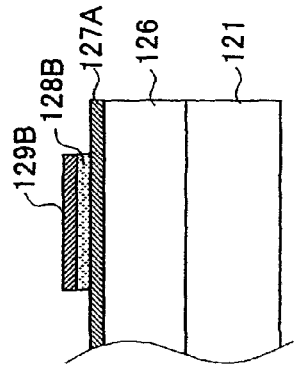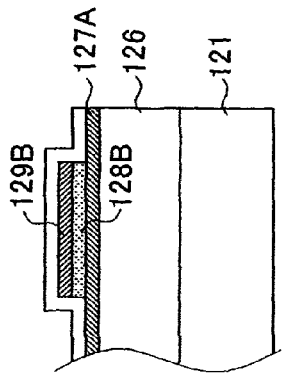
FIG.6A FIG.6B FIG.6C

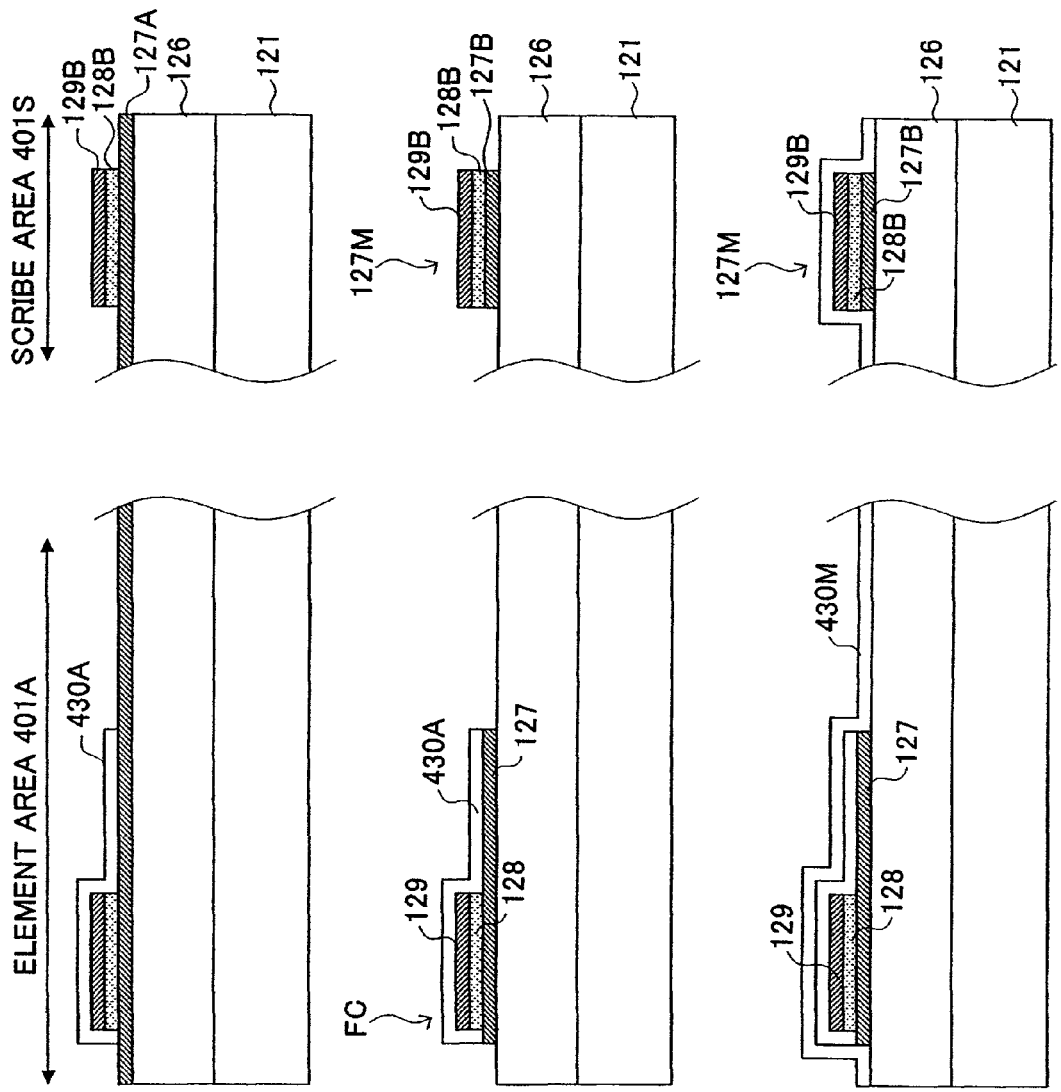

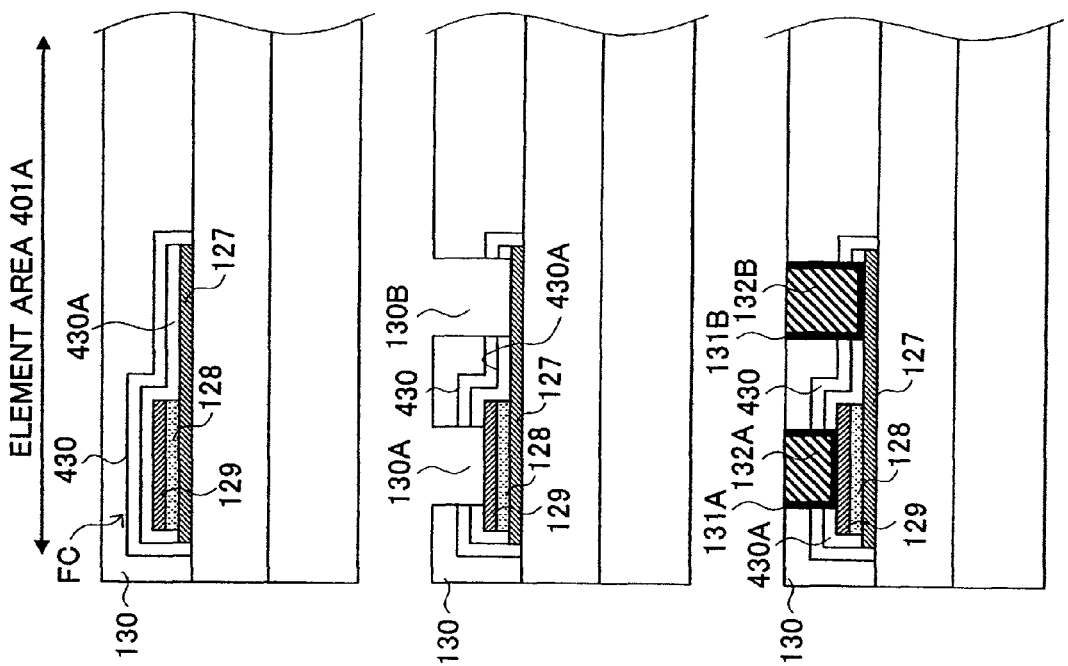

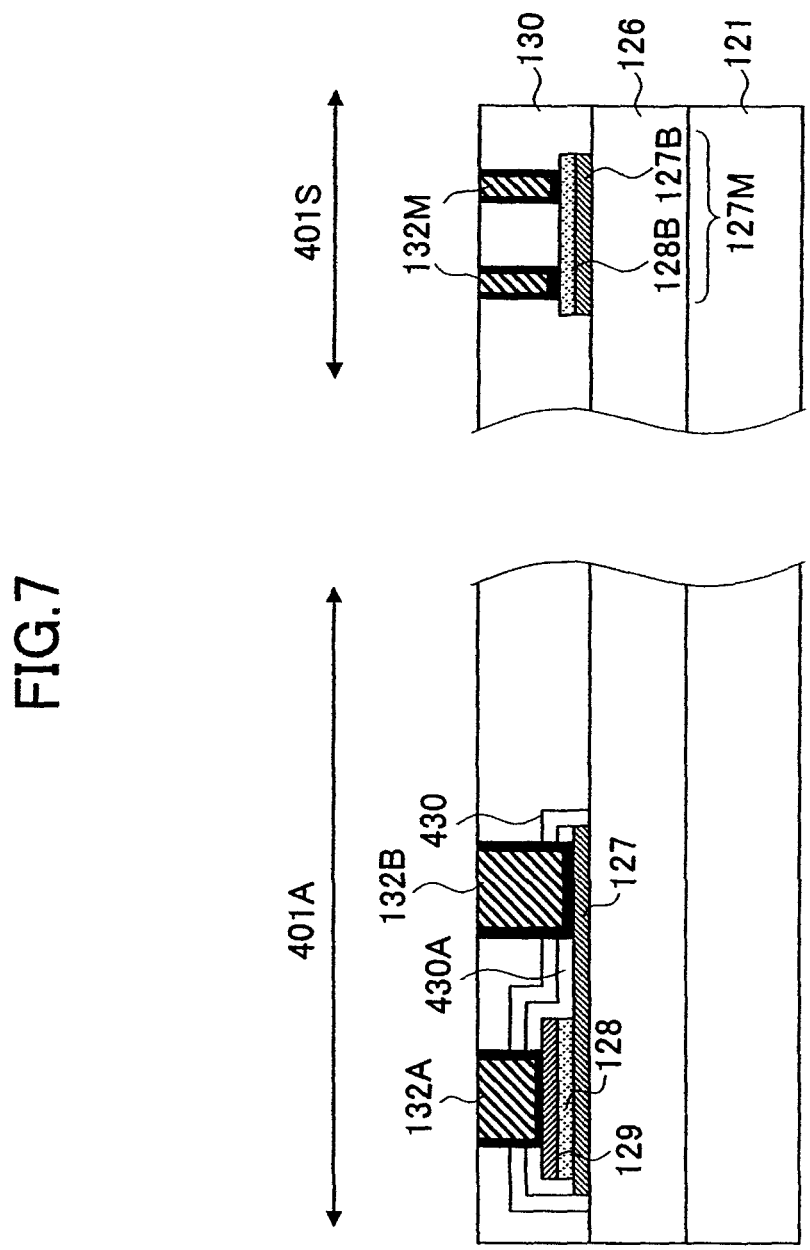

SEMICONDUCTOR SUBSTRATE AND METHOD OF FABRICATING SEMICONDUCTOR DEVICE

This application is a divisional of application Ser. No. 11/507,536, filed on Aug. 22, 2006, which is a divisional of application Ser. No. 10/914,332, filed on Aug. 10, 2004, now U.S. Pat. No. 7,115,994 issued Oct. 3, 2006, which is based upon and claims the benefit of priority from the prior Japanese Patent Application No. 2004-080770, filed on Mar. 19, 2004, the entire contents of which are incorporated herein by reference.

BACKGROUND OF THE INVENTION

1. Field of the Invention

The present invention generally relates to a semiconductor device, and more particularly to a semiconductor substrate, a semiconductor device having a ferroelectric film and method for fabricating the semiconductor device.

2. Description of the Related Art

A semiconductor memory device such as DRAM and SRAM is widely used as a high speed main memory device in an information processing devices such as a computer. However, since this memory device is a volatile memory device, the information stored therein will be lost once the power is turned off. Meanwhile, a non-volatile magnetic disk device is used as a large size auxiliary memory device for storing programs and data.

The magnetic disk device has problems such as, having a large size, being mechanically vulnerable, consuming a large amount of electricity, and having a slow access speed when reading/writing information. In recent years, as another non-volatile auxiliary memory device, an EEPROM or a flash memory, which stores information by applying voltage to a floating gate electrode, is widely used. The flash memory is particularly expected to be used as a large capacity memory device matching to the magnetic disk device since the flash memory has a similar cell structure that allows formation with high integrated density.

However, since information is written by applying hot electron to a floating gate electrode via a tunnel insulating film, the EEPROM or flash memory has problems such as requiring time for writing information and deteriorating the tunnel insulating film from repetitive writing/erasing of information. Such deteriorated tunnel insulating film causes writing and erasing operation to become unsteady.

As another memory device, a ferroelectric memory device (hereinafter referred to as "FeRAM"), which stores information by intrinsic polarization of a ferroelectric film, is proposed. Similar to the DRAM, the FeRAM has each memory cell transistor of the FeRam structured as a single MOSFET, in which the dielectrics in the memory cell capacitor is replaced with ferroelectric material such as PZT (Pb (Zr, Ti) $O_3$), PLZT (Pb (Zr, Ti, La)$O_3$), SBT (SrBi$_2$Ta$_2$O$_3$), or SBTN (SrBi2 (Ta, Nb)2O3). Thus structured, integration of high integrated density can be obtained. Since the FeRAM controls intrinsic polarization of a ferroelectric capacitor by impressing of electric field, writing speed is no less than 1000 times faster than that of the EEPROM or the flash memory which write information by applying hot electron, and also reduces electric power consumption to approximately $\frac{1}{10}$. In addition, since the FeRAM requires no tunnel oxide film, the FeRAM can attain a longer longevity, and perform re-writing operations one hundred thousand times more than the flash memory.

FIG. 1 shows a conventional FeRAM 20.

In FIG. 1, the FeRAM 20 is formed on a P-type or N-type Si substrate 21, in which the Si substrate 21 is defined by a field insulating film 22 and includes a P-type well 21A and an N-type well 21B. A gate electrode 24A, having a polycide structure, is formed above the P-type well 21A via a gate insulating film 23A. Further, a gate electrode 24B, also having a polycide structure, is formed above the N-type well 21B via a gate insulating film 23B. In the P-type well 21A, N-type diffusion areas 21a, 21b are formed on both sides of the gate electrode 24A. In the N-type well 21B, P-type diffusion areas 21c, 21d are formed on both sides of the gate electrode 24B. Outside the active area, the gate electrode 24A extends over a field oxide film (element separation film) 22, and forms a part of an FeRAm word line (WL).

Each of the gate electrodes 24A, 24B has a side wall insulating film. Above the Si substrate 21, an SiON cover film 25 is formed in a manner covering the field insulating film 22, in which the SiON cover film 25 is formed into a thickness of approximately 200 nm by a CVD method.

A $SiO_2$ layer-interposed insulating film 26 is formed in a manner covering the cover film 25, in which the $SiO_2$ layer-interposed insulating film 26 is formed into a thickness of approximately 1 µm by a CVD method employing TEOS gas. The surface of the layer-interposed insulating film 26 planarized by a CMP method.

A ferroelectric capacitor is formed above the planarized layer-interposed insulating film 26, in which the ferroelectric capacitor has a lower electrode 27, a ferroelectric capacitor insulating film 28, and an upper electrode 29 orderly stacked above each other. The lower electrode 27 is formed of a Ti film with a thickness of 10-30 nm (more preferably, approximately 20 nm) and a Pt film with a thickness of 100-300 nm (more preferably, approximately 175 nm). The ferroelectric capacitor insulating film 28 is a film of PZT ((Pb (Zr, Ti) $O_3$) or PZLT ((Pb, La) (Zr, Ti) $O_3$) with a thickness of 100-300 nm (more preferably, approximately 240 nm). The upper electrode 29, disposed above the ferroelectric capacitor insulating film 28, is a film of IrOx with a thickness of 100-300 nm (more preferably, 200 nm). Further, the Ti film and the Pt film are formed, typically, by sputtering. The ferroelectric capacitor insulating film 28, typically after sputtering, is crystallized by rapid thermal processing in a oxygen atmosphere of 725° C. for 20 seconds. It is preferable to add Ca and Sr to the ferroelectric capacitor insulating film 28. Further, the ferroelectric capacitor insulating film 28 can not only be formed by a sputtering method, but alternatively formed by a spin-on method, a sol-gel method, a MOD (metal organic deposition) method, or a MOCVD method. As alternatives for using a PZT film or a PLZT film as the ferroelectric capacitor insulating film 28, an SBT (SrBi$_2$ (Ta, Nb)$_2$ O$_9$) film, or a BTO (Bi$_4$Ti$_2$O$_{12}$) film may, for example, be used. Furthermore, by using a high dielectric film (e.g. a BST ((Ba, Sr)TiO$_3$) film, or a STO (SrTiO3) film) as an alternative for the ferroelectric capacitor insulating film 28, a DRAM can be formed. Further, the IrOx film of the upper electrode 29 is typically formed by sputtering. A Pt film or an SRO (SrRuO$_3$) film may be used as alternatives for the IrOx film.

In a case where the ferroelectric capacitor is exposed to a reducing atmosphere, particularly to hydrogen, during a semiconductor process, the ferroelectric capacitor insulating film 28 is easily deoxidized, thereby resulting to severe deterioration of electric property. Therefore, the ferroelectric capacitor insulating film 28 is covered by an encapsulation layer 330A formed of Al$_2$O$_3$, in which the encapsulation layer 330A is formed with a thickness of approximately 50 nm by employing a sputtering method. Further, the encapsulation layer 330A is covered by another encapsulation layer 330 also formed of $Al_2O_3$, in which the other encapsulation layer 330 is formed with a thickness of approximately 20 nm. The other encapsulation layer 330 serves as a barrier layer for preventing hydrogen from entering.

An SiO2 layer-interposed insulating film 30 is formed on the encapsulation layer 330 by a CVD method (more preferably, a Plasma CVD (P-CVD) method) using, for example, $SiH_4$, a polysilane compound such as $Si_2F_6$, $Si_3F_8$, $Si_2F_3Cl$, $SiF_4$, or TEOS, in which the SiO2 layer-interposed insulating film 30 is formed above the upper electrode 29 with a thickness of approximately 400 nm. Contact holes 30A, 30B are formed in the layer-interposed insulating film 30 for exposing the upper and lower electrodes 29, 27, respectively. Further, contact holes 30C, 30D, 30E, and 30F are disposed in the layer-interposed insulating film 26 for exposing the diffusion areas 21a, 21b, 21c, and 21d, respectively. A contact hole 30G is formed in the layer-interposed insulating film 30 for exposing the word line patter WL formed on the element separation film 22.

In the conventional FeRAM 20 shown in FIG. 1, contacting films 31A and 31B, formed of conductive nitride material (e.g. TiN) with a thickness of approximately 50 nm, are respectively formed in the contact holes 30A and 30B in a manner directly contacting the inner wall surfaces of the contact holes 30A and 30B, or directly contacting the surfaces of the exposed upper or lower electrodes 29, 27. By applying a CVD method using a mixed gas of $WF_6$, Ar, and $H_2$, a conductive plug (W plug) 32A, formed of W, is formed on the contacting film 31A of the contact hole 30A, and a conductive plug (W plug) 32B, also formed of W, is formed on the contacting film 31B of the contact hole 30B.

In a likewise manner, contacting films 31C-31G are formed at the inner wall surfaces of the contact holes 30C-30G, and W plugs 32C-32G are formed on the contacting films 31C-31G.

Further, wiring patterns 33A-33F, formed of Al, are disposed on the layer-interposed insulating film 30 in correspondence with the W plugs 32A-32G. The wiring patterns 33A-33F are covered by a further layer-interposed insulating film 34 formed of $SiO_2$, in which the layer-interposed insulating film 34 is formed by a P-CVD method using, for example, $SiH_4$, a polysilane compound such as $Si_2F_6$, $Si_3F_8$, $Si_2F_3Cl$, $SiF_4$, or TEOS, similar as the layer-interposed insulating film 30.

Further, a protective film 35, formed of SiO2, is formed on the layer-interposed insulating film 34 with a thickness of 100 nm or more by using a P-CVD method. The protective film 35 serves to cover exposed slits (cavities) formed after a planarizing process (CMP) executed after the formation of the layer-interposed insulating film 34.

Further, contact holes 35A, 35B are formed in a manner piercing the protective film 35 and the layer-interposed insulating film 34 for exposing the wiring patterns 33A and 33F, respectively. Further, W plugs 37A, 37B are formed on the inners wall surface of the contact holes 35A, 35B via contacting films (TiN contacting layers) 36A, 36B.

Further, wiring patterns 38A, 38B, formed of Al or Al alloy, are formed on the protective film 35 in a manner contacting the W plugs 37A, 37B. In forming the wiring patterns 38A, 38B, the contacting films 36A, 36B are disposed extending between the wiring patterns 38A, 38B and the protective film 35 in a manner covering the inner wall surfaces of the contact holes 35A, 35B.

Further, a layer-interposed insulating film 39, formed in a manner similar to that of layer-interposed insulating film 30 and 34, is disposed covering the wiring patterns 38A, 38B.

Further, a protective film 40, similar to the protective film 35, is formed on the layer-interposed insulating film 39. Then, wiring patterns 41A-41E including a bit line (BL) pattern is formed on the protective film 40.

The FeRAM 20 shown in FIG. 1 is fabricated according to the steps shown in FIGS. 2A-2F.

In the step shown in FIG. 2A, the Si substrate 21 is provided with diffusion areas 21a-21d and is mounted with polycide gate electrodes 24a, 24B. The SiO2 layer-interposed insulating film 26 is formed with a thickness of approximately 1 μm on the Si substrate 21 in a manner covering the polycide gate electrodes 24A, 24B by using the P-CVD method with TEOS. Further, the SiO2 layer-interposed insulating film 26 is planarized with the CMP method. Then, on the planarized layer-interposed insulating film 26, the Ti film and the Pt film are orderly deposited with a thickness of 20 nm and 175 nm, respectively. Then, on the deposited film, the PLZT film (preferably added with Ca and Sr) is formed with a thickness of 240 nm by sputtering. Thereby, the ferroelectric film is obtained. The PLZT film (ferroelectric film) is crystallized by being subjected to rapid thermal processing in an oxygen atmosphere of 725° C. for 20 seconds at a heating rate of 125° C./second. After the ferroelectric film is crystallized, the IrOx film with a thickness of 200 nm is formed on the ferroelectric film by the sputtering method.

Then, the upper electrode 29 is formed by patterning the IrOx film with resist (resist process). After the resist process, the ferroelectric film is thermally processed again in an oxygen atmosphere of 650° C. for 60 minutes, to thereby compensate for the deficit of oxygen in the ferroelectric film during the processes of sputtering and patterning the IrOx film.

Then, a resist pattern is formed in a manner covering the upper electrodes. Using the resist pattern as a mask, the ferroelectric film is patterned, to thereby obtain the ferroelectric capacitor insulating film 28. After the ferroelectric capacitor insulating film 28 is formed, the ferroelectric film is thermally processed in a nitrogen atmosphere, so as to dehydrate the inside of the layer-interposed insulating film 26.

Further, the $Al_2O_3$ film is sputtered to the Pt/Ti layer in normal temperature in a manner covering the ferroelectric capacitor insulating film 28 and the upper electrode 29. Thereby, the encapsulation layer 330A is obtained for protecting the ferroelectric capacitor insulating film 28 from H2. After the encapsulation layer 330A is formed, a thermal process is executed in an oxygen atmosphere of 550° C. for 60 minutes so that the film quality of the encapsulation layer 330A can be enhanced.

Then, a resist pattern is formed on the encapsulation layer 330A. Using the resist pattern on the encapsulation layer 330A as a mask, the Pt/Ti layer is patterned, to thereby obtain the lower electrode 27.

Further, after the resist used for obtaining the lower electrode 27 is removed, and executing a thermal process of 350° C. for 30 minutes, the $Al_2O_3$ film is sputtered on the layer-interposed insulating film 26. Thereby, another encapsulation layer 330 (second encapsulation layer) is formed in a manner covering the encapsulation layer 330A.

Further, a thermal process of 650° C. is executed for 30 minutes after the formation of the encapsulation layer 330 so that the damage created in the ferroelectric capacitor insulating film 28 can be relieved. Further, the layer-interposed insulating film 30, having a thickness of approximately 1200 nm, is formed on the encapsulation layer 330 by a P-CVD method using, for example, $SiH_4$, a polysilane compound such as $Si_2F_6$, $Si_3F_8$, $Si_2F_3Cl$, $SiF_4$. Alternatively, the layer-interposed insulating film 30 may also be formed by using TEOS. A thermal excitation CVD method or a laser excitation CVD method may be employed as alternatives of the P-CVD method. Then, the layer-interposed insulating film 30 is polished and planarized by the CMP method until having a thickness of approximately 400 nm (measured from the surface of the upper electrode 29).

Next, in the step shown in FIG. 2B, the layer-interposed insulating film 30 is dehydrated by using $N_2$ plasma or $N_2O$ plasma. Then, in a resist process using CHF3 and a mixed gas of CF4 and Ar, the contact holes 30A and 30B are formed in the layer-interposed insulating film 30 in a manner penetrating the encapsulation layers 330 and 330A and allowing the upper electrode 29 and the lower electrode 27 to be exposed. Then, in this state, a thermal process is executed in an oxygen atmosphere at 60° C. for 60 minutes. This enables recovery in film quality of the ferroelectric capacitor insulating film 28 deteriorated during the formation of the contact holes 30A and 30B.

In the step shown in FIG. 2C, resist pattern R having aperture portions corresponding to contact holes 30C-30F is applied to the structure shown in FIG. 2B. Using the resist pattern R as a mask, the layer-interposed insulating films 30 and 26 are patterned to form the contact holes 30C-30F, thereby exposing the diffusion areas 21a-21d. Since the formation of contact hole G (see FIG. 1) is simple, a detail description thereof is omitted.

In the step shown in FIG. 2D, the resist pattern R is removed, and a pre-treating process of Ar plasma etching is executed. Then, the TiN film 31 is sputtered to the layer-interposed insulating film 30 in a manner continuingly covering the inner wall surface and bottom surface of the contact hole 31A and the inner wall surface and bottom surface of the contact hole 31B. The TiN film is formed with a thickness of approximately 50 nm. The TiN film contacts the exposed part of the upper electrode 29 at the bottom surface of the contact hole 30A, and contacts the exposed part of the lower electrode 27 at the bottom surface of the contact hole 30B. Further, the TiN film also contacts the exposed parts of the diffusion areas 21a-21d at the contact holes 30C-30F.

In the step shown in FIG. 2E, the W layer 32 is deposited on the TiN film 31 by a CVD method using $WF_6$, Ar, and $H_2$ in a manner filling the contact holes 30C-30F.

Although $H_2$ is used in the CVD method in the step shown in FIG. 2E, the H2 will not reach the ferroelectric film 28 since the ferroelectric capacitor containing the ferroelectric film 28 is overlappingly covered by the encapsulation layers 330, 330A and the TiN film 31. Therefore, the property of the ferroelectric capacitor can be prevented from being deteriorated by deoxidization.

In the step shown in FIG. 2F, the W layer 32 on the layer-interposed insulating film 30 is polished/removed by a CMP method. As a result, W plugs 32A-32F, formed from the portions of the W layer remaining in the contact holes 30A-30F, are obtained. In addition, as a result of the use of the CMP method, the TiN film on the layer-interposed insulating film 30 is planarized, to thereby obtain TiN patterns 31A-31F corresponding to the contact holes 30A-30F.

Among the W plugs 32A-32F, although the W plug 32A, formed of IrOx, contacts the upper electrode 29 via the TiN pattern 31A, the TiN pattern 31A does not react to conductive oxides such as IrOx. Therefore, no increase of contact resistance will occur.

Then, by performing a typical procedure of forming a multi-layer wiring structure to the structure shown in FIG. 2F, the FeRAM shown in FIG. 1 is obtained.

With the above-described conventional FeRAM 20 using the $Al_2O_3$ encapsulation layers 330, 330A as hydrogen barriers, the thickness of the encapsulation layers 330, 330A are required to be increased for effectively preventing entry of hydrogen and maintaining the electric property of the ferroelectric capacitor in a case where the size of the ferroelectric capacitor is reduced in correspondence with size-reduction of the FeRAM 20. Accordingly, in recent FeRAMs, the $Al_2O_3$ encapsulation layer 330A is provided with an increased thickness of, for example, 50 nm, and the $Al_2O_3$ encapsulation layer 330 is provided with an increased thickness of, for example, 100 nm.

However, in using the FeRAM 20 having encapsulation layers 330, 330A with increased thicknesses, corrosion or peeling may occur at an alignment mark situated at a scribe line. Furthermore, alignment becomes difficult, particularly, during the formation of the contact holes 30A, 30B in the step shown in FIG. 2B, and particles are created, thereby resulting to a considerable yield loss in fabricating the FeRAM.

SUMMARY OF THE INVENTION

It is a general object of the present invention to provide a semiconductor substrate and method for fabricating a semiconductor device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor substrate and method for fabricating a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor substrate including: a wafer including an element area and a non-element area delineating the element area; a first layered structure situated in the element area; a first insulating film covering the first layered structure, and exhibiting a first etching rate with respect to an etching recipe; a second insulating film covering the first layered structure covered by the first insulating film in the element area, and exhibiting a second etching rate with respect to the etching recipe, the second etching rate being greater than the first etching rate; and a second layered structure situated in the non-element area; wherein the second layered structure includes at least a portion of the first layered structure.

In the semiconductor substrate according to an embodiment of the present invention, the second insulating film may include a first aperture portion penetrating the first insulating film in a manner exposing the first layered structure, a first conductive pattern disposed in the first aperture portion, a second aperture portion exposing the second layered structure, and a second conductive pattern disposed in the second aperture portion.

In the semiconductor substrate according to an embodiment of the present invention, the second layered structure may be in contact with the second insulating film.

In the semiconductor substrate according to an embodiment of the present invention, the second layered structure may have a same layer structure as the first layered structure.

In the semiconductor substrate according to an embodiment of the present invention, the second layered structure may be formed as a first alignment mark, wherein the second layered structure may have a second alignment mark formed in correspondence with the first alignment mark.

In the semiconductor substrate according to an embodiment of the present invention, the first insulating film may be a film for preventing hydrogen from entering the etching recipe.

In the semiconductor substrate according to an embodiment of the present invention, the first insulating film may contain $Al_2O_3$.

In the semiconductor substrate according to an embodiment of the present invention, the first layered structure may be a capacitor structure including a lower electrode, a ferroelectric film situated on the lower electrode, and an upper electrode situated on the upper electrode.

In the semiconductor substrate according to an embodiment of the present invention, the second layered structure may include a first layer corresponding to the lower electrode, the first layer being formed with a material same as that of the lower electrode and a thickness same as that of the lower electrode, a second layer corresponding to the ferroelectric film, the second layer being situated on the first layer, and being formed with a material same as that of the ferroelectric film and a thickness same as that of the ferroelectric film, and a third layer corresponding to the upper electrode, the third layer being situated on the second layer, and being formed with a material same as that of the upper electrode and a thickness same as that of the upper electrode.

In the semiconductor substrate according to an embodiment of the present invention, the non-element area may be a scribe line formed on the wafer for delineating the element area.

Furthermore, the present invention provides a semiconductor device including a wafer including an element area and a non-element area delineating the element area; a first layered structure situated in the element area; a first insulating film covering the first layered structure, and exhibiting a first etching rate with respect to an etching recipe; a second insulating film covering the first layered structure covered by the first insulating film in the element area, and exhibiting a second etching rate with respect to the etching recipe, the second etching rate being greater than the first etching rate; and a second layered structure situated in the non-element area; wherein the second layered structure includes at least a portion of the first layered structure.

Furthermore, the present invention provides a method of fabricating a semiconductor device including the steps of: forming a first layered structure on a base layer in an element area of a wafer, the element area being delineated by a non-element area; covering the first layered structure with a first insulating film that exhibits a first etching rate with respect to an etching recipe; covering the first layered structure, being covered by the first insulating film, with a second insulating film that exhibits a second etching rate with respect to the etching recipe, the second etching rate being greater than the first etching rate; forming a first aperture portion in the second insulating film in a manner exposing the first layered structure; forming a conductive plug in the first aperture portion; forming a second layered structure in the non-element area simultaneously with the step of forming the first layered structure, the second layered structure including at least a portion of the first layered structure; forming a second aperture portion simultaneously with the step of forming the first aperture portion in a manner exposing the second layered structure; and forming a conductive pattern simultaneously with the step of forming the conductive plug in the second aperture portion.

In the method of fabricating a semiconductor device according to an embodiment of the present invention, the method may further include a step of determining an alignment between the second layered structure and the conductive pattern.

In the method of fabricating a semiconductor device according to an embodiment of the present invention, the first layered structure may include a ferroelectric film.

In the method of fabricating a semiconductor device according to an embodiment of the present invention, the first insulating film may be a film for preventing hydrogen from entering the etching recipe.

In the method of fabricating a semiconductor device according to an embodiment of the present invention, the first insulating film may contain $Al_2O_3$.

In the method of fabricating a semiconductor device according to an embodiment of the present invention, the non-element area may be a scribe line formed on the wafer, wherein the wafer is diced along the scribe line.

Accordingly, with the present invention, even when a considerable amount of time is used in etching the first insulating film for forming the first aperture portion in the element area, the second layered structure prevents the second aperture portion in the non-element area from being formed too deep to an extent reaching the semiconductor substrate (layer). This may be applied to a case where, for example, the first conductive pattern is formed in the second insulating film in a manner penetrating the first insulating film and contacting the first layered structure, at the same time of forming the second conductive pattern in the non-element area as a mark pattern. Therefore, even when a conductive pattern is formed in the first and second aperture portions by a CVD method using, $WF_6$ material gas, for example, the gas would not contact the semiconductor substrate. Accordingly, corrosive gas generated by material gas contacting to the semiconductor substrate can be prevented. As a result, a clear-defined (satisfactorily-shaped) conductive pattern can be formed in the second aperture portion. Furthermore, since generation of corrosive gas can be prevented, generation of undesired particles can be effectively restrained, to thereby improve fabrication yield of the semiconductor device.

With the present invention, the second layered structure and the second conductive pattern in the non-element area can be utilized as alignment patterns, to thereby obtain a precise alignment with respect to the first layered structure and the first conductive pattern.

With the present invention, the first layered structure is restricted by the first insulating film by forming the second layered structure in a manner contacting the second insulating film. As a result, etching process time can be reduced for forming, for example, via holes or contact holes reaching to levels below the first layered structure owing to the presence of the first insulating film.

With the present invention, increase in the steps (processes) for fabrication can be prevented since the second layered structure is formed with a same layer structure as the first layered structure.

With the present invention, alignment with respect to the first layered structure and the first conductive pattern can be positively detected (determined). Furthermore, the second layered structure can be utilized as a first alignment mark.

With the present invention, the first insulating film can prevent hydrogen from entering. Furthermore, by employing a film containing $Al_2O_3$ as the first insulating film, the first layered structure can be protected from hydrogen and a deoxidizing atmosphere containing hydrogen.

With the present invention, a ferroelectric memory can be formed in the element area. With the present invention no additional process in fabrication, since the first and second layered structures are formed having corresponding layers of same material and corresponding layers with same thickness.

With the present invention, the element area can be efficiently used by employing the scribe line as the non-element area.

Other objects and further features of the present invention will be apparent from the following detailed description when read in conjunction with the accompanying drawings.

BRIEF DESCRIPTION OF THE DRAWINGS

FIGS. 2A-2F are schematic diagrams showing the steps of fabricating the FeRAM shown in FIG. 1;

FIGS. 3A-3F are schematic diagrams for explaining the principle of the present invention;

FIGS. 4A-4B are schematic diagrams showing a structure of a semiconductor wafer according to a first embodiment of the present invention;

FIGS. 6A-6I are schematic diagrams showing the steps of fabricating the semiconductor wafer including the FeRAM shown in FIG. 5;

FIG. 7 is a schematic diagram showing a structure of a wafer including an FeRAM according to a second embodiment of the present invention.

DESCRIPTION OF THE PREFERRED EMBODIMENTS

In the following, embodiments of the present invention regarding a semiconductor substrate and method for fabricating a semiconductor device will be described with reference to the accompanying drawings.

[Principle]

Figure 1:
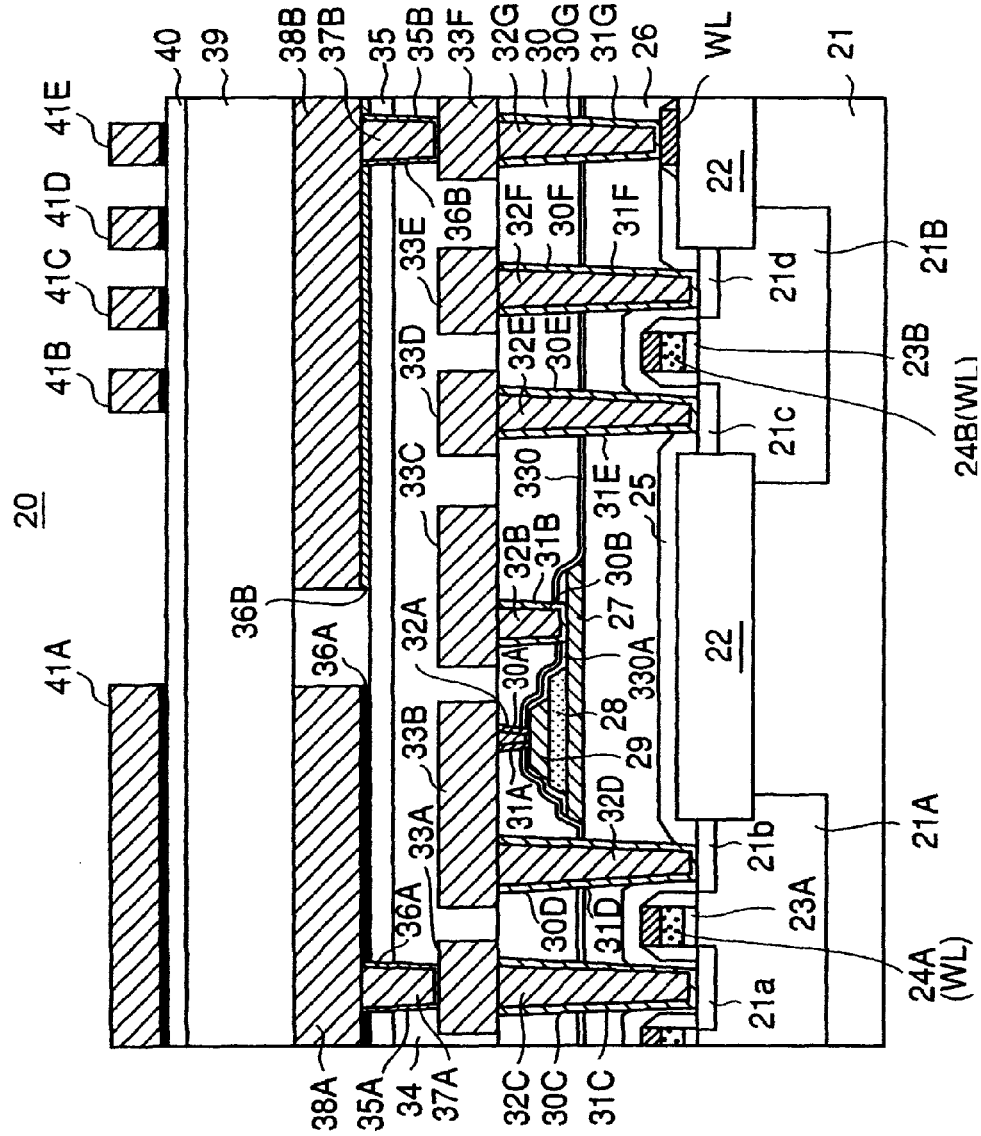
FIG. 1 is a schematic drawing showing a structure of a conventional FeRAM.
Figure 2E:
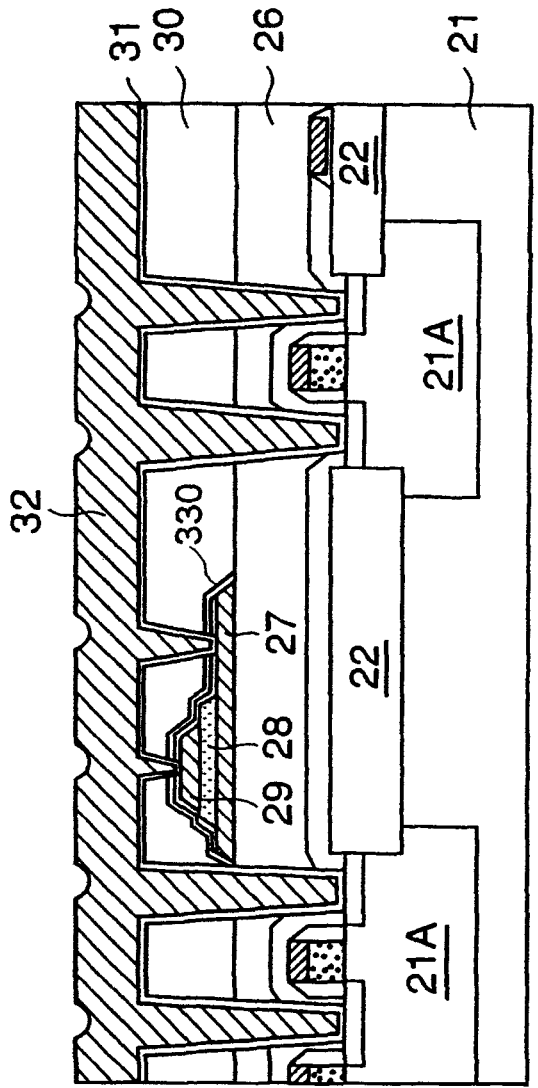
Figure 2F:
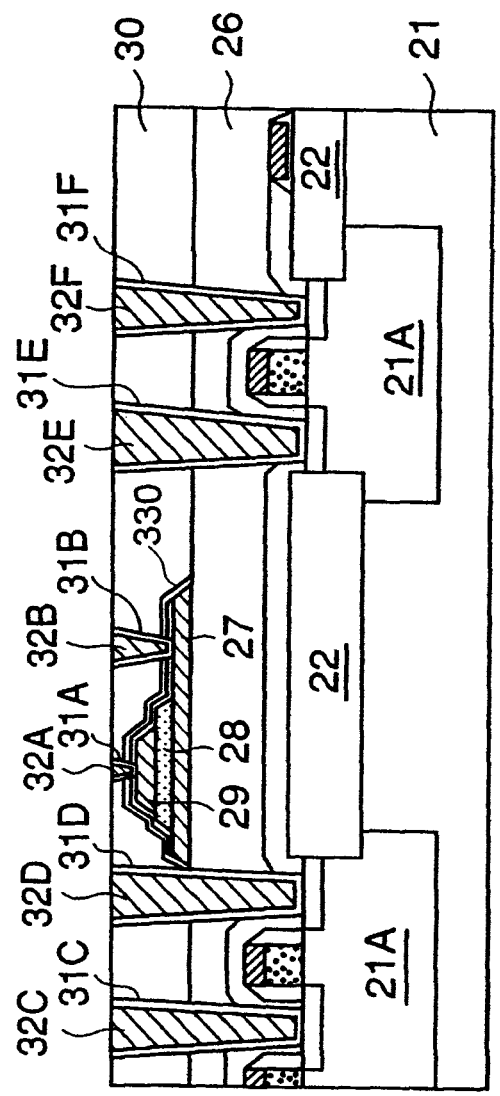

FIGS. 3A-3F are explanatory drawings for explaining a mechanism of corrosion or peeling occurring at an alignment mark of the FeRAM 20 shown in FIG. 1. In FIGS. 3A-3F, like components are denoted by like numerals as of those shown in FIGS. 1 and 2A-2F and will not be further explained.

FIGS. 3A-3F are drawings showing the steps of FIGS. 2A and 2B in more detail.

In FIG. 3A, the FeRAM 20 shown in FIG. 1 is formed at a cell area (element area) 21C of the substrate 21. The cell area 21C is defined by a scribe area 21D.

follows:
In the step shown in FIG. 3A, a conductive film 270 corresponding to the lower electrode 27, a ferroelectric film corresponding to the ferroelectric capacitor insulating film 28, and another conductive film corresponding to the upper electrode 29 are orderly formed on the layer-interposed insulating film 26 in the cell area 21C. By patterning the films with resist, the ferroelectric capacitor insulating film 28 and the upper electrode 29 is formed on the conductive film 270. Furthermore, the Al$_2$O$_3$ pattern (encapsulation layer) 330A is formed on the conductive film 270 in a manner covering the ferroelectric capacitor insulating film 28, the upper electrode, and an area of the conductive film at which the lower electrode 27 is to be formed.

In the step shown in FIG. 3B, the conductive film 270 is patterned. As a result, the lower electrode 27 is formed in the cell area 21C, and an alignment mark pattern 27M is formed in the scribe area 21D.

In the step shown in FIG. 3C, the Al$_2$O$_3$ film 330 is uniformly formed on the structure shown in FIG. 3B. In the step shown in FIG. 3C, the Al$_2$O$_3$ film 330 covers the alignment pattern 27M in the scribe area 21D.

As shown in FIG. 3C, the Al$_2$O$_3$ film 330 covers not only the alignment mark pattern 27, but the entire layer-interposed insulating film 26 of the substrate 21. The existence of the Al$_2$O$_3$ film 330 covering the entire layer-interposed insulating film 26, for example, reduces process efficiency in the formation of contact holes 30C-30F deeply penetrated to the substrate surface as shown in FIG. 2C. Therefore, in the step shown in FIG. 3D, the Al$_2$O$_3$ film 330 is patterned, to thereby allow the Al$_2$O$_3$ film 330 to remain only on the lower electrode 27 of the ferroelectric capacitor. In addition, the alignment mark pattern 27M in the scribe area 21D is exposed (see FIG. 3D) as a result of the patterning.

In the step shown in FIG. 3D, the layer-interposed insulating film 30 is formed on the layer-interposed insulating film 26 in a manner covering the ferroelectric capacitor in the cell area 21C and the alignment mark pattern 27M in the scribe area 21D.

In the step shown in FIG. 3E, the contact holes 30A and 30B are formed in the layer-interposed insulating film 30 based on the alignment mark pattern 27M, in a manner exposing the upper electrode 29 and the lower electrode 27, respectively. Further, in the scribe area 21D, aperture portions 30$m$ are formed according to another alignment mark pattern (sub-pattern) corresponding to the alignment mark pattern 27M (main pattern). In FIG. 3E, the barrier film is not shown for the purpose of simplification.

In the step shown in FIG. 3E, the etching process for forming the contact holes 30A, 30B require a considerable amount of time since the apertures of the contact holes 30A, 30B are required to penetrate the Al$_2$O$_3$ films 330 and 330A. Particularly with recent FeRAMs, in which the ferroelectric capacitor is size-reduced in correspondence with size-reduction of the element, the Al$_2$O$_3$ films 330 and 330A are formed with increased thicknesses due to a greater need to prevent hydrogen from entering (for example, the Al$_2$O$_3$ film 330 formed with a thickness of 100 nm, Al$_2$O$_3$ film 330A formed with a thickness of 50 nm). As a result, an extensive amount of time is required in the step shown in FIG. 6E.

However, as the time in performing the step shown in FIG. 6E becomes longer, the aperture portion 30$m$ in the scribe area 21D becomes remarkably deeper, thereby penetrating the layer-interposed insulating film 26, and further reaching the silicon substrate 21. It is to be noted that there is no Al$_2$O$_3$ film disposed beneath the aperture portion 30$m$ in the scribe area 21D.

Accordingly, in a case where the aperture portion 30$m$ reaches the silicon substrate 21 as shown in FIG. 3F (corresponding to FIG. 2F), a reaction generated between a portion of the silicon substrate 21 exposed by the aperture portion 30 and a gas containing F such as WF$_6$ used in the CVD process, in which W is filled in the contact holes 30A, 30B, and the aperture portion 30 for forming the contact plugs 32A, 32B, and the alignment mark (sub-mark) 32M. For example, a reaction of

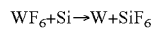

creates a corrosive reactive gas of $SiF_6$.

The corrosive reactive gas causes irregularity at the side wall surface of the mark pattern 32M, thereby creating gaps and peeled portions. Furthermore, the alignment precision, which is based on the distance δ between the main mark pattern 27M and the sub-mark pattern 32M, is reduced. In addition, alignment precision for alignment processes performed afterwards may also be adversely affected. Furthermore, particles may scatter onto the substrate surface, thereby resulting to yield loss in fabricating the FeRAM.

First Embodiment

FIGS. 4A and 4B show a semiconductor wafer 401 formed with an FeRAM 400 according to a first embodiment of the present invention, in which the semiconductor wafer 401 formed with the FeRAM 400 is able to solve the above-described problems. FIG. 4A is an overall view of the semiconductor wafer 401, and FIG. 4B is a partial enlarged plane view of the semiconductor wafer 401 shown in FIG. 4A.

With reference to FIGS. 4A and 4B, numerous scribe areas 401S are disposed on the semiconductor wafer 401 in a grid-like manner. The scribe areas 401S define element areas (cell areas) 401A-401I arranged in a grid-like manner on the semiconductor wafer 401. Further, alignment mark patterns 401M are disposed on the scribe areas 401S in the proximity of respective element areas 401A-401I. Further, each element area 401A-401I is formed with an FeRAM including a ferroelectric capacitor.

Figure 5:
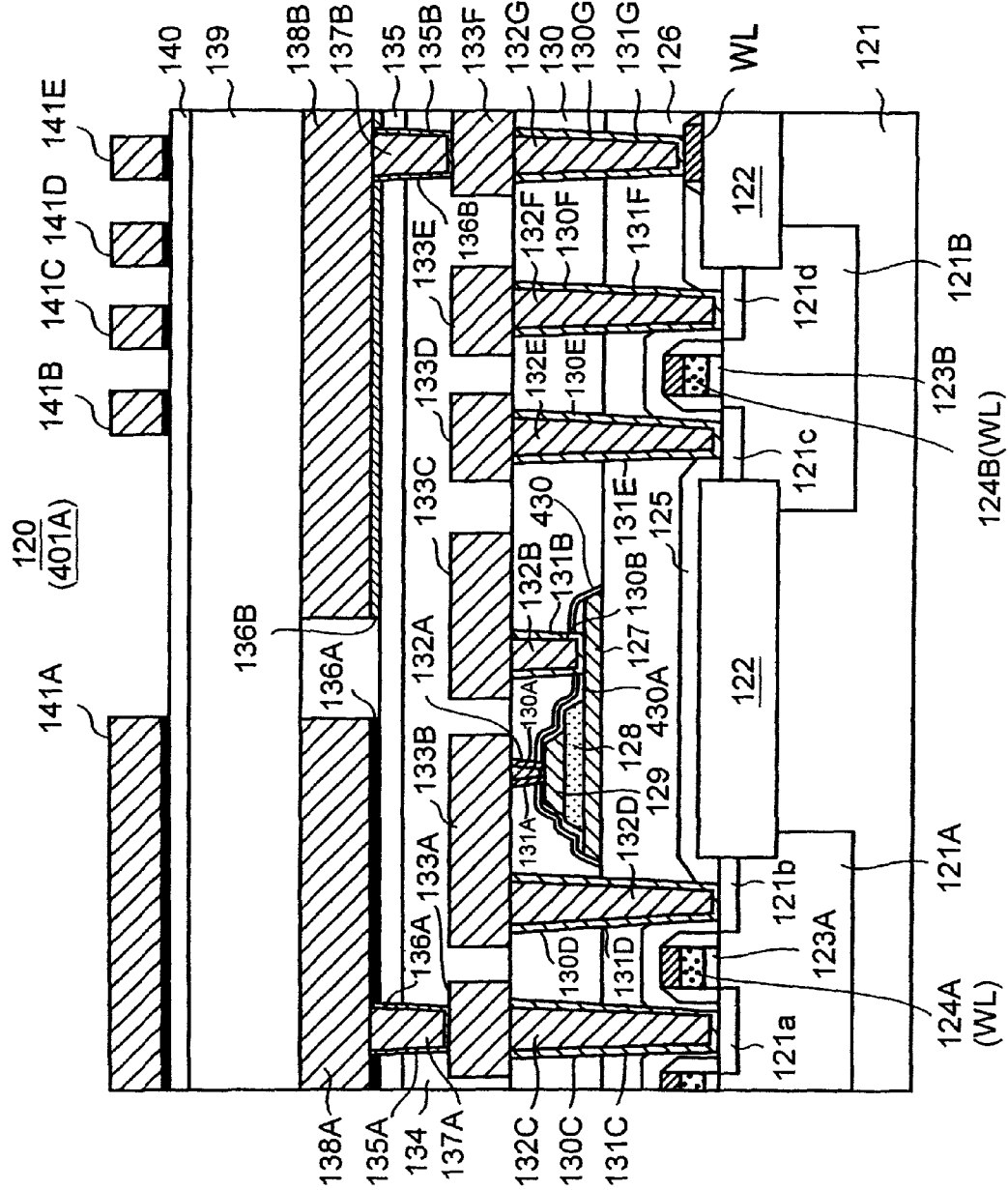
FIG. 5 is a schematic diagram showing a structure of a FeRAM formed in the semiconductor wafer shown in FIGS. 4A-4B.

FIG. 5 is a cross-sectional view showing a structure of the FeRAM of the element area 401A.

The FeRAM shown in FIG. 5 has a structure similar to that of the FeRAM shown in FIG. 1.

In FIG. 5, the FeRAM 120 is formed on a P-type or N-type Si substrate 121, in which the Si substrate 121 is defined by a field insulating film 122 and includes a P-type well 21A and an N-type well 121B. A gate electrode 124A, having a polycide structure, is formed above the P-type well 121A via a gate insulating film 123A. Further, a gate electrode 124B, also having a polycide structure, is formed above the N-type well 121B via a gate insulating film 123B. In the P-type well 121A, N-type diffusion areas 121a, 121b are formed on both sides of the gate electrode 124A. In the N-type well 121B, P-type diffusion areas 121c, 121d are formed on both sides of the gate electrode 124B. Outside the active area, the gate electrode 124A extends over a field oxide film (element separation film) 122, and forms a part of an FeRAM word line (WL).

Each of the gate electrodes 124A, 124B has a side wall insulating film. Above the Si substrate 121, an SiON cover film 125 is formed in a manner covering the field insulating film 122, in which the SiON cover film 125 is formed into a thickness of approximately 200 nm by a CVD method.

A $SiO_2$ layer-interposed insulating film 126 is formed in a manner covering the cover film 125, in which the $SiO_2$ layer-interposed insulating film 126 is formed into a thickness of approximately 1 μm by a CVD method employing TEOS gas. The surface of the layer-interposed insulating film 126 planarized by a CMP method.

A ferroelectric capacitor is formed above the planarized layer-interposed insulating film 126, in which the ferroelectric capacitor has a lower electrode 127, a ferroelectric capacitor insulating film 128, and an upper electrode 129 orderly stacked above each other. The lower electrode 127 is formed of a Ti film with a thickness of 10-30 nm (more preferably, approximately 20 nm) and a Pt film with a thickness of 100-300 nm (more preferably, approximately 175 nm). The ferroelectric capacitor insulating film 128 is a film of PZT ((Pb (Zr, Ti) $O_3$) or PZLT ((Pb, La) (Zr, Ti)$O_3$) with a thickness of 100-300 nm (more preferably, approximately 240 nm). The upper electrode 129, disposed above the ferroelectric capacitor insulating film 128, is a film of IrOx with a thickness of 100-300 nm (more preferably, 200 nm). Further, the Ti film and the Pt film are formed, typically, by sputtering. The ferroelectric capacitor insulating film 128, typically after sputtering, is crystallized by rapid thermal processing in a oxygen atmosphere of 725° C. for 20 seconds. It is preferable to add Ca and Sr to the ferroelectric capacitor insulating film 128. Further, the ferroelectric capacitor insulating film 128 can not only be formed by a sputtering method, but alternatively formed by a spin-on method, a sol-gel method, a MOD (metal organic deposition) method, or a MOCVD method. As alternatives for using a PZT film or a PLZT film as the ferroelectric capacitor insulating film 128, an SBT (SrBi$_2$ (Ta, Nb)$_2$O$_9$) film, or a BTO (Bi$_4$Ti$_2$O$_{12}$) film may, for example, be used. Furthermore, by using a high dielectric film (e.g. a BST ((Ba, Sr)TiO$_3$) film, or a STO (SrTiO$_3$) film) as an alternative for the ferroelectric capacitor insulating film 128, a DRAM can be formed. Further, the IrOx film of the upper electrode 129 is typically formed by sputtering. A Pt film or an SRO (SrRuO$_3$) film may be used as alternatives for the IrOx film.

In a case where the ferroelectric capacitor is exposed to a reducing atmosphere, particularly to hydrogen, during a semiconductor process, the ferroelectric capacitor insulating film 128 is easily deoxidized, thereby resulting to severe deterioration of electric property. Therefore, the ferroelectric capacitor insulating film 128 is covered by an encapsulation layer 430A formed of Al$_2$O$_3$, in which the encapsulation layer 430A is formed with a thickness of approximately 50 nm by employing a sputtering method. Further, the encapsulation layer 430A is covered by another encapsulation layer 430 also formed of Al$_2$O$_3$, in which the other encapsulation layer 430 is formed with a thickness of approximately 20 nm. The other encapsulation layer 430 serves as a barrier layer for preventing hydrogen from entering.

An $SiO_2$ layer-interposed insulating film 130 is formed on the encapsulation layer 430 by a CVD method (more preferably, a Plasma CVD (P-CVD) method) using, for example, SiH$_4$, a polysilane compound such as Si$_2$F$_6$, Si$_3$F$_8$, Si$_2$F$_3$Cl, SiF$_4$, or TEOS, in which the $SiO_2$ layer-interposed insulating film 130 is formed above the upper electrode 129 with a thickness of approximately 400 nm. Contact holes 130A, 130B are formed in the layer-interposed insulating film 130 for exposing the upper and lower electrodes 129, 127, respectively. Further, contact holes 130C, 130D, 130E, and 130F are disposed in the layer-interposed insulating film 126 for exposing the diffusion areas 121a, 121b, 121c, and 121d, respectively. A contact hole 130G is formed in the layer-interposed insulating film 130 for exposing the word line patter WL formed on the element separation film 122.

In the conventional FeRAM 20 shown in FIG. 1, contacting films 131A and 131B, formed of conductive nitride material (e.g. TiN) with a thickness of approximately 50 nm, are respectively formed in the contact holes 130A and 130B in a manner directly contacting the inner wall surfaces of the contact holes 130A and 130B, or directly contacting the surfaces of the exposed upper or lower electrodes 129, 127. By applying a CVD method using a mixed gas of WF$_6$, Ar, and H$_2$, a conductive plug (W plug) 132A, formed of W, is formed on the contacting film 131A of the contact hole 130A, and a conductive plug (W plug) 132B, also formed of W, is formed on the contacting film 131B of the contact hole 130B.

In a likewise manner, contacting films 131C-131G are formed at the inner wall surfaces of the contact holes 130C-130G, and W plugs 132C-132G are formed on the contacting films 131C-131G.

Further, wiring patterns 133A-133F, formed of Al, are disposed on the layer-interposed insulating film 130 in correspondence with the W plugs 132A-132G. The wiring patterns 133A-133F are covered by a further layer-interposed insulating film 134 formed of $SiO_2$, in which the layer-interposed insulating film 134 is formed by a P-CVD method using, for example, $SiH_4$, a polysilane compound such as $Si_2F_6$, $Si_3F_8$, $Si_2F_3Cl$, $SiF_4$, or TEOS, similar as the layer-interposed insulating film 130.

Further, a protective film 135, formed of $SiO_2$, is formed on the layer-interposed insulating film 134 with a thickness of 100 nm or more by using a P-CVD method. The protective film 135 serves to cover exposed slits (cavities) formed after a planarizing process (CMP) executed after the formation of the layer-interposed insulating film 134.

Further, contact holes 135A, 135B are formed in a manner piercing the protective film 135 and the layer-interposed insulating film 134 for exposing the wiring patterns 133A and 133F, respectively. Further, W plugs 137A, 137B are formed on the inners wall surface of the contact holes 135A, 135B via contacting films (TiN contacting layers) 136A, 136B.

Further, wiring patterns 138A, 138B, formed of Al or Al alloy, are formed on the protective film 135 in a manner contacting the W plugs 137A, 137B. In forming the wiring patterns 138A, 138B, the contacting films 136A, 136B are disposed extending between the wiring patterns 138A, 138B and the protective film 135 in a manner covering the inner wall surfaces of the contact holes 135A, 135B.

Further, a layer-interposed insulating film 139, formed in a manner similar to that of layer-interposed insulating film 130 and 134, is disposed covering the wiring patterns 138A, 138B. Further, a protective film 140, similar to the protective film 135, is formed on the layer-interposed insulating film 139. Then, wiring patterns 141A-141E including a bit line (BL) pattern is formed on the protective film 140.

Since the fabrication process of the FeRAM 120 shown in FIG. 5 is similar to that shown in FIGS. 2A-2F, further description thereof is omitted.

Next, among the fabrication processes (steps) of the FeRAM 120, a formation process of the ferroelectric capacitor and the Al2O3 films 430, 430A covering the capacitor id described along with a formation process of an alignment mark of the scribe area(s) 401S with reference to FIGS. 6A-6F.

In the step shown in FIG. 6A, the layer-interposed insulating film 126 is disposed on the silicon substrate 121 corresponding to the silicon wafer 401 shown in FIG. 5. The conductive layer 127A for forming the lower electrode 127, the ferroelectric film 128A for forming the ferroelectric capacitor insulating film 128, and the conductive layer 129A for forming the upper electrode 129 is disposed on the layer-interposed insulating film 126 in a manner uniformly covering the element area 401A and the scribe area 401S. The ferroelectric capacitor insulating film 128 and the upper electrode 129 are formed on the conductive layer 127A in the element area 401A by patterning, in order, the conductive film 129A and the ferroelectric film 128A in the step shown in FIG. 6B.

In the step shown in FIG. 6B, the ferroelectric film 129A in the scribe area 401S is patterned to thereby obtain a conductive pattern 129B simultaneously with the formation of the electrode 129, in which the conductive pattern 129B has a composition and a thickness that are the same as those of the upper electrode 129. Further, by patterning the ferroelectric film 128A in the scribe area 401S, a ferroelectric pattern 128B is formed below the conductive pattern 129B simultaneously with the formation of the ferroelectric capacitor insulating film 128. Further, the structure shown in FIG. 6B is thermally processed in an oxygen atmosphere for compensating a deficit of oxygen inducted in the ferroelectric capacitor insulating film 128. In the step of FIG. 6B, a same mask is used for patterning both the upper electrode 129 and the conductive pattern 129B, and a same mask is used for patterning both the ferroelectric capacitor insulating film 128 and the ferroelectric pattern 128B.

In the step shown in FIG. 6C, an $Al_2O_3$ film 430N forming the encapsulation layer 430A is formed, for example, with a thickness of 50 nm in a manner uniformly covering the element area 401A and the scribe area 401S. In the step shown in FIG. 6D, the $Al_2O_3$ film 430N is patterned in a manner allowing $Al_2O_3$ film 430N to remain only in the area at which the ferroelectric capacitor is formed. Thereby, the encapsulation layer 430A is formed.

In the step shown in FIG. 6E, the lower electrode 127 is formed by patterning the conductive film 127A. Accordingly, a ferroelectric capacitor FC including the lower electrode 127 is obtained in the element area 401A. At the same time of the formation of the lower electrode 127, a conductive pattern 127B is formed in the scribe area 401S. Accordingly, an alignment mark pattern 127M, formed of the conductive pattern 127B, the ferroelectric pattern 128B, and the conductive pattern 129B, is obtained in the scribe area 401S. In the step of FIG. 6E, a same mask is used for patterning both the lower electrode 127 and the conductive pattern 127B.

In the step shown in FIG. 6F, an $Al_2O_3$ film 430M corresponding to the encapsulation layer 430 is formed, for example, with a thickness of 100 nm in a manner uniformly covering the element area 401A and the scribe area 401S. In the step shown in FIG. 6G, the encapsulation layer (second encapsulation layer) 430 is formed by patterning the $Al_2O_3$ film 430M in a manner allowing the encapsulation layer 430 to cover the ferroelectric capacitor FC via the $Al_2O_3$ encapsulation layer 430A. As a result of the step of FIG. 6G, the alignment mark pattern 127M, which is covered by the $Al_2O_3$ film 430M in the step of FIG. 6F, becomes exposed. Further, in the step shown in FIG. 6G, the layer-interposed insulating film 130 is formed on the layer-interposed insulating film 126.

In the step shown in FIG. 6H, a mask alignment process is performed based on the alignment mark pattern 127M. Then, in accordance with the mask alignment, a photolithography process and a dry-etching process are performed, in which contact holes 130A, 130B are formed in the layer-interposed insulating film 130 in the element area 401A in a manner penetrating the encapsulation layers 430, 430A, and exposing the upper electrode 129 and the lower electrode 127, respectively. By using the same mask, the aperture portion (alignment aperture portion) 130m, which exposes the conductive pattern 129B of the alignment mark pattern 127M, is formed in the scribe area 401S at the same time of the formation of the contact holes 130A, 130B. The dry-etching process in the step of FIG. 6H is performed by using, for example, an ICP type high density plasma etching apparatus.

In the step shown in FIG. 6H, although a considerable amount of etching time may still be required for penetrating the encapsulation layers 430, 430A, and the alignment aperture portion 130m may still be excessively etched to some extent, the rate of etching the alignment aperture portion 130m can be reduced once the alignment mark pattern 127M becomes exposed. This owes to the alignment mark pattern 127M, which has the same structure as the ferroelectric capacitor, being disposed below the alignment aperture portion 130m. Therefore, unlike the step shown in FIG. 3E, the alignment aperture portion 130m will not entirely penetrate the layer-interposed insulating film 126 and reach the silicon substrate 121.

In the step shown in FIG. 6H, the mask alignment process for forming the contact holes 130A, 130B are performed by using the alignment aperture portion 130m and the alignment mark pattern 127M in a resist process. This enables the contact holes 130A and 130B to be accurately aligned with respect to the ferroelectric capacitor FC.

In the step shown in FIG. 6I, a TiN film, serving as contact layer, is deposited to the structure shown in FIG. 6H by sputtering. Further, the W film is deposited thereon by a CVD method using a vapor $WF_6$ material. Thereby, the contact holes 130A, 130B and the alignment aperture portion 130m is filled with the W film via the TiN contact film. Further, unnecessary TiN film and W film remaining on the layer-interposed insulating film 130 is removed by a CMP method. Consequently, a structure shown in FIG. 6I is obtained, wherein the contact hole 130A is filled by the W plug 132A via the TiN contact film 131A, the contact hole 130B is filled by the W plug 132B via the TiN contact film 131B, and the alignment aperture portion 130m is filled by the W pattern 132M via the TiN contact film 132N. Here, the alignment mark pattern 127M serves as a main mark pattern, and the W pattern 132M serves as a sub mark pattern.

Since mask alignment is performed using the alignment aperture portion 130m and the alignment mark pattern 127M in the step shown in FIG. 6H, the state of alignment of, for example, the structure shown in FIG. 6I, can be monitored by measuring the distance between the main mark pattern 127M and the sub mark pattern 132M.

As described above, the mark pattern 127M stops excessive penetration of the aperture portion 130m and prevents the aperture portion 130m from reaching the silicon substrate 121 in the dry-etching process for forming the contact holes 130A, 130B, as shown in FIG. 6H. Accordingly, even when tungsten is employed for filling the contact holes 130A, 130B, a WF6 gas, for example, used in a CVD method will not contact the silicon substrate 121, and generation of a corrosive gas such as $SiF_6$ can be prevented.

In the step shown in FIG. 6I, by forming the alignment pattern 132M having a well-defined edge, and using the alignment pattern 132M as a main pattern, a subsequent wiring pattern can be further formed to the structure shown in FIG. 6I.

In addition, since the present invention prevents generation of corrosive gas, peeling in the mark pattern 132M can be prevented. Accordingly, the generation of particles, which lead to yield loss of the semiconductor device, can be prevented.

Further, the subsequent wiring pattern is applied on the structure shown in FIG. 6I to form a multilayer wiring structure. Last, the silicon wafer 401 (see FIG. 4A), forming the silicon substrate 121, is diced along the scribe areas 401S, to thereby allow each of the element areas 401A-401I to separate as semiconductor integrated circuit chips.

Although the first embodiment of the present invention is described using the element area 401A shown in FIG. 4B, the description applies to the other element areas 401B-401I.

Second Embodiment

FIG. 7 is a cross-sectional view showing a wafer including a semiconductor device according to a second embodiment of the present invention. Like components are denoted by like numerals as of those in the first embodiment and will not be further explained.

In the second embodiment, the conductive pattern 129B disposed at an upper-most portion of the alignment pattern 127M in the scribe area 401S is removed, to thereby obtain an alignment pattern 127M having stack layers of the conductive pattern 127B and the ferroelectric pattern 128B.

Similar to advantages of the first embodiment, the structure of the second embodiment prevents the alignment aperture portion 130m from penetrating the ferroelectric pattern 128B and the lower pattern 127B and advancing into the layer-interposed insulating layer 126 during the etching process as shown in FIG. 6H.

Third Embodiment

Figure 8:
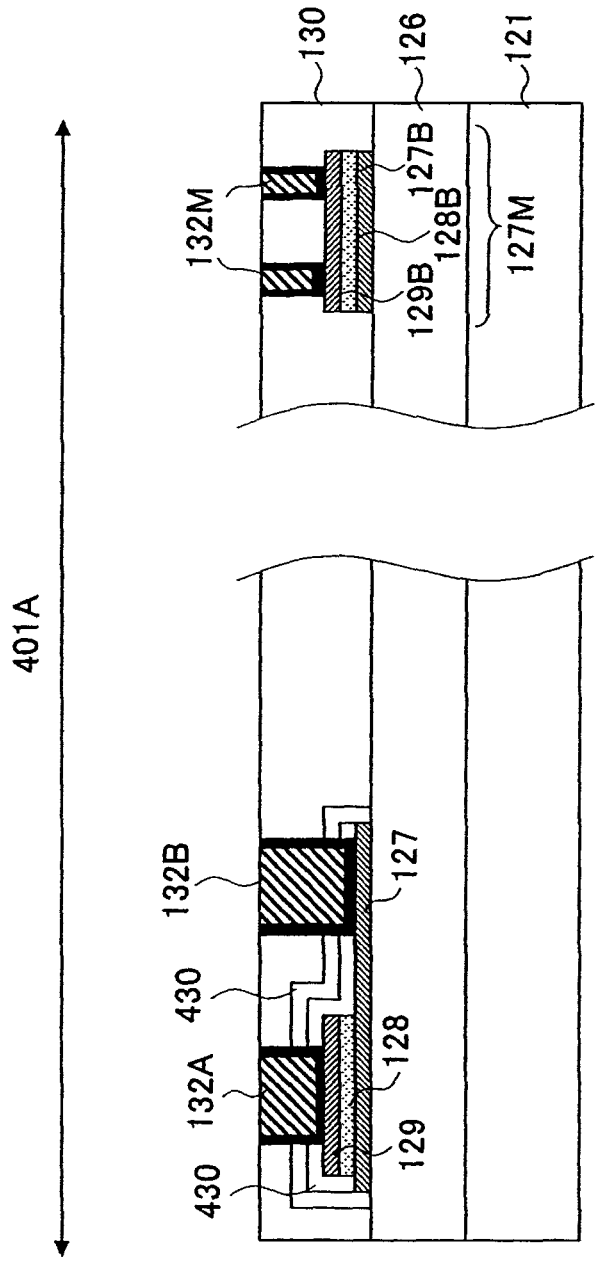
FIG. 8 is a schematic diagram showing a structure of an FeRAM according to a third embodiment of the present invention.

FIG. 8 is a cross-sectional view showing a wafer including a semiconductor device according to a third embodiment of the present invention. Like components are denoted by like numerals as of those in the above-described embodiments and will not be further explained.

In FIG. 8, the alignment pattern 127M is formed not in a scribe area, but in an unused part of the element area 401A.

Thus structured, a more accurate alignment can be performed since the alignment mark pattern 127M is formed in the vicinity of the ferroelectric capacitor.

Furthermore, with the third embodiment shown in FIG. 8, the alignment mark pattern 127M may be used as a ferroelectric capacitor according to necessity.

In addition, the present invention is not to be limited in use for fabrication of FeRAMs. The present invention may be effectively applied to a typical fabrication process of a semiconductor device, in which there is a difference in etching speed (etching rate) between different layers of a predetermined etching recipe.

Further, the present invention is not limited to these embodiments, but various variations and modifications may be made without departing from the scope of the present invention.

The present application is based on Japanese priority application No. 2004-080770 filed on Mar. 19, 2004 with the Japanese Patent Office, the entire contents of which are hereby incorporated by reference.

What is claimed is:

1. A method of fabricating a semiconductor device comprising:
    forming a first layered structure on a base layer in an element area which is delineated by a non-element area of a wafer, and a second layered structure which includes a same layer structure as the first layered structure in the non-element area simultaneously with the forming the first layered structure;
    covering the first layered structure and the second layered structure with a first insulating film;
    removing the first insulating film over the second layered structure with patterning the first insulating film;
    covering the first layered structure, being covered by the first insulating film, with a second insulating film;
    forming a first aperture portion in the second insulating film in a manner exposing the first layered structure;
    forming a conductive plug in the first aperture portion;
    forming a second aperture portion, having a depth different than the first aperture portion, simultaneously with the forming the first aperture portion in a manner exposing the second layered structure; and forming a conductive pattern simultaneously with the forming the conductive plug in the second aperture portion;

wherein the non-element area is a scribe line formed on the wafer wherein the wafer is diced along the scribe line.

2. The method of fabricating a semiconductor device as claimed in claim 1, further comprising determining an alignment between the second layered structure and the conductive pattern.

3. The method of fabricating a semiconductor device as claimed in claim 1, wherein the first layered structure includes a ferroelectric film.

4. The method of fabricating a semiconductor device as claimed in claim 1, wherein the first insulating film is a film for preventing hydrogen from entering the etching recipe.

5. The method of fabricating a semiconductor as claimed in claim 1, wherein the first insulating film contains $Al_2O_3$.

6. The method of fabricating a semiconductor device as claimed in claim 1, further comprising a step of performing a mask alignment for forming the first aperture portion by using the second layered structure after the step of covering the first layered structure with the second insulating film and before the step of forming the first aperture portion.

* * * * *